(12) United States Patent
Zhao et al.

(10) Patent No.: US 9,472,562 B1
(45) Date of Patent: Oct. 18, 2016

(54) SEMICONDUCTOR DEVICE AND METHOD FOR FABRICATING THE SAME

(71) Applicant: UNITED MICROELECTRONICS CORP., Hsinchu (TW)

(72) Inventors: Qiu-Ji Zhao, Singapore (SG); Ling Wu, Singapore (SG); Wei Meng, Singapore (SG); Zhi-Hui Jiao, Singapore (SG); Zhi-Guo Li, Singapore (SG); Chi Ren, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/726,984

(22) Filed: Jun. 1, 2015

(30) Foreign Application Priority Data

Apr. 28, 2015 (CN) .......................... 2015 1 0207915

(51) Int. Cl.
*H01L 27/115* (2006.01)

(52) U.S. Cl.
CPC ... *H01L 27/11534* (2013.01); *H01L 27/11573* (2013.01)

(58) Field of Classification Search
CPC .................... H01L 27/11534; H01L 27/11573

USPC .......................................................... 257/314
See application file for complete search history.

(56) References Cited

U.S. PATENT DOCUMENTS

| 5,393,687 A * | 2/1995 | Liang ................ H01L 21/28525 148/DIG. 35 |
| 2006/0037938 A1* | 2/2006 | Yue ........................ G01N 21/73 216/59 |
| 2015/0072489 A1* | 3/2015 | Baker, Jr. .......... H01L 29/66833 438/267 |

* cited by examiner

*Primary Examiner* — Fernando L Toledo
*Assistant Examiner* — Adam S Bowen
(74) *Attorney, Agent, or Firm* — WPAT, PC; Justin King

(57) ABSTRACT

A semiconductor device includes a substrate, a plurality of memory cells, a logic gate electrode and a high-voltage gate electrode. The substrate at least includes a memory area, a high-voltage area and a logic area. The memory cells are disposed in the memory area. The logic gate electrode is disposed on the logic area. The high-voltage gate electrode has a first portion and a second portion in contact with each other and stacked on the high-voltage area. The high-voltage gate electrode has a thickness substantially greater than that of the logic gate electrode.

17 Claims, 8 Drawing Sheets

SEMICONDUCTOR DEVICE AND METHOD FOR FABRICATING THE SAME

This application claims the benefit of People's Republic of China application Serial No. 201510207915.4, filed Apr. 28, 2015, the subject matter of which is incorporated herein by reference.

BACKGROUND

1. Technical Field

The disclosure relates in generally related to a semiconductor device and the method for fabricating the same, and more particularly to a semiconductor device with memory cells, logic elements and high-voltage elements, as well as the method for fabricating the same.

2. Description of the Related Art

An non-volatile memory (NVM) device which is able to continually store information even when the supply of electricity is removed from the device containing NVM cells has been widespreadly adopted by bulk solid state memory applications in the art. Because the process for fabricating the NVM device offers good compatibility with the silicon integrated circuit (IC) process, the NVM device is thus usually integrated with complementary metal oxide semiconductors (CMOSs) to form an embedded memory device, a silicon IC device including at least one NVM device (such as a flash memory cell), at least one logic element (such as a MOS transistor) and other semiconductor device (such as a high-voltage transistor) integrated on a substrate.

Conventionally, in order to reduce the manufacturing cost, etching steps using identical reticles for etching polysilicon may be utilized to form the gate electrodes of the logic element and the high-voltage transistor on a substrate, during the process for fabricating an embedded memory device. Another reticle is then adopted to form the word lines of the NVM device integrated on the same substrate. However, since the reticle that is merely prepared for forming the word lines of the NVM device has lower transmission rate (RT), thus it is more difficult to control the etching steps to stop at a desired etching, in comparison with the process prepared for forming the gate electrodes of the logic element and the high-voltage transistor. As a result, problems either in over etch or otherwise in excess etch residue may occur due to lack of process window.

Furthermore, there are other problems faced by the conventional approaches. Because the electrodes of the logic element and the high-voltage transistor that are formed by the same etching steps using identical reticles have the same thickness, additional ion implantation processes, such as tilt ion implantation or/and doping process for forming a guard ring, may be required to make the high-voltage transistor to reach a predetermined breakdown voltage. The process window of the embedded memory device could be further reduced by the needed ion implantation processes.

Therefore, there is a need of providing an improved semiconductor device and the method for fabricating the same to obviate the drawbacks encountered from the prior art.

SUMMARY

One aspect of the present invention is to provide a semiconductor device, wherein the semiconductor device includes a substrate, a plurality of memory cells, a logic gate electrode and a high-voltage gate electrode. The substrate at least includes a memory area, a high-voltage area and a logic area. The memory cells are disposed on the memory area. The logic gate electrode is disposed on the logic area. The high-voltage gate electrode has a first portion and a second portion in contact with each other and stacked on the high-voltage area. The high-voltage gate electrode has a thickness substantially greater than that of the logic gate electrode.

In accordance with the another aspect of the present invention, a method for fabricating a semiconductor device is provided, wherein the method includes steps as follows: Firstly, a substrate at least including a memory area, a high-voltage area, a logic area and a plurality of memory cells formed on the memory area is provided. A first conductive layer and a capping layer are then formed in sequence to cover the memory area, the high-voltage area and the logic area. Next, a portion of the capping layer covered on the memory area and the high-voltage area is removed. A second conductive layer is formed to cover the remaining portion of the capping layer and a portion of the first conductive layer disposed on the memory area and the high-voltage area. A planarization process is performed using the remaining portion of the capping layer as a stop layer. After the remaining portion of the capping layer is removed, portions of the first conductive layer and the second conductive layer are removed to define at least one word line electrically connected to one of the memory cells on the memory area and to define at least one high-voltage gate electrode on the high-voltage area. Subsequently, at least one logic gate electrode is defined on the logic area, wherein the high-voltage gate electrode has a thickness substantially greater than that of the logic gate electrode.

In accordance with the aforementioned embodiments of the present invention, a semiconductor device and method for fabricating the same are provided, wherein a substrate including at least one memory area, a high-voltage area, a logic area and a plurality of memory cells formed on the memory area is firstly provided. Next, a first conductive layer and a capping layer are formed in sequence to cover the memory area, the high-voltage area and the logic area. A portion of the capping layer covering on the memory area and the high-voltage area is then removed, and a second conductive layer directly in contact with the first conductive layer is formed on the memory area and the high-voltage area. Subsequently, portions of the first conductive layer and the second conductive layer disposed on the memory area and the logic area are removed by etch steps using the same reticle, so as to define at least one word line electrically connected to one of the memory cells on the memory area and simultaneously to define at least one high-voltage gate electrode on the high-voltage area. Thereinafter, another reticle is utilized to perform another etching process to remove the portion of the first conductive layer disposed on the logic area, whereby at least one logic gate electrode is defined on the logic area and the high-voltage gate has a thickness substantially greater than that of the logic gate electrode.

Since the reticle provided by the present invention that is prepared both to define the word line and to define the high-voltage gate electrode can have a RT substantially greater than the conventional reticle that is merely prepared for forming the word lines, thus the endpoint of the etching step that utilize the present reticle for removing the portions of the first conductive layer and the second conductive layer can be determined by an endpoint detection rather than the traditional approach of which determining the end point by counting the etching time. Such that the etching process of the present method can be controlled more precisely. In addition, because the high-voltage gate electrode formed by the present method having a thickness substantially greater than that of the logic gate electrode, thus the resulted high-voltage transistor can have a breakdown voltage higher than that of the logic transistor formed on the logic area, the predetermined voltage standard can be reached easier and additional ion implantations may be unnecessary. As a result the process window of the semiconductor device can be greatly enlarged.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION

Figure 1A:
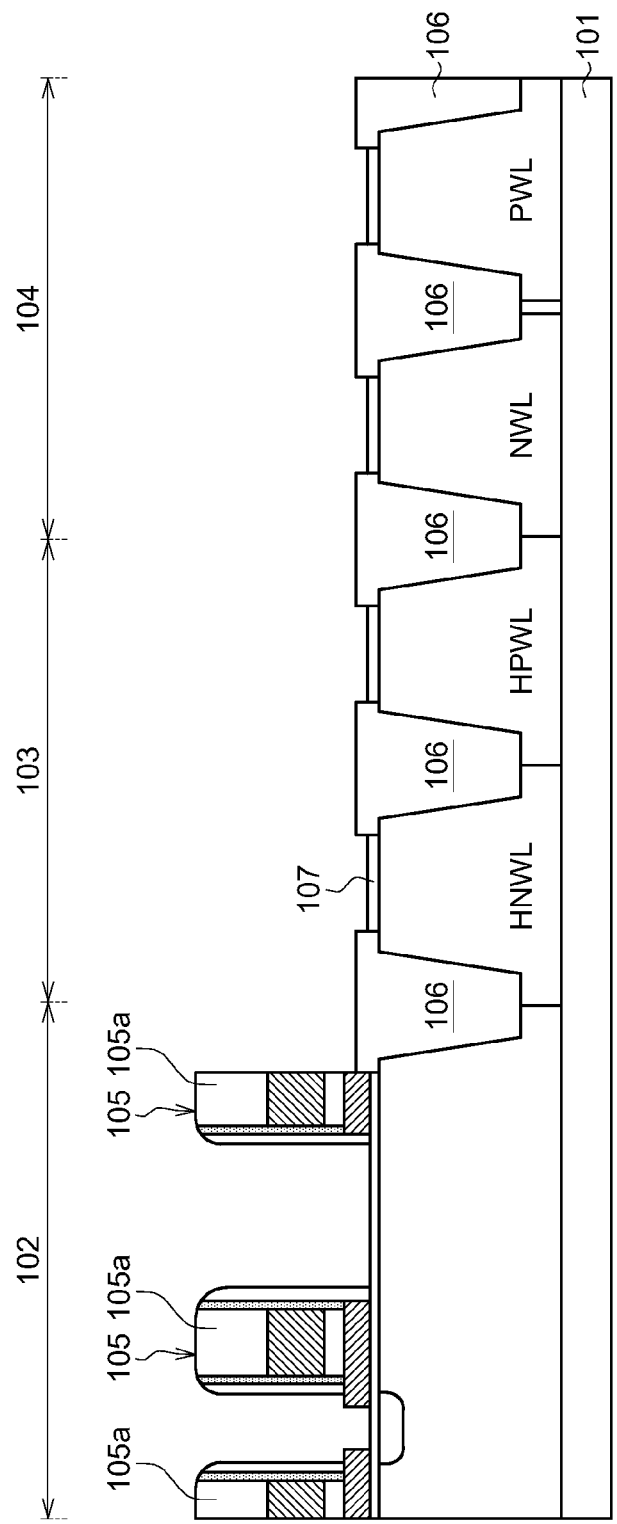
FIGS. 1A to 1H are cross-sectional views illustrating the processing structures for fabricating a semiconductor device in accordance with one embodiment of the present invention.

The embodiments as illustrated below provide a semiconductor device and method for fabricating the same to solve the manufacturing problems due to lack of process window. The present invention will now be described more specifically with reference to the following embodiments illustrating the structure and arrangements thereof.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily drawn to scale, and the identical elements of the embodiments are designated with the same reference numerals.

FIGS. 1A to 1H are cross-sectional views illustrating the processing structures for fabricating a semiconductor device 100 in accordance with one embodiment of the present invention. The method for fabricating the semiconductor device 100, such as an embedded memory device, includes steps as follows: Firstly, a substrate 101 is provided, wherein the substrate 101 includes at least one memory area 102, a high-voltage area 103, a logic area 104 and a plurality of memory cells 105 formed on the memory area 102 (see FIG. 1A).

In some embodiments of the present invention, the substrate 101 may be a silicon substrate, such as a silicon wafer. The memory area 102, the high-voltage area 103, the logic area 104 and the memory cells 105 are formed by a front-end-of-line (FEOL) process carried out on the substrate 101. The memory area 102, the high-voltage area 103 and the logic area 104 are isolated by a plurality of isolating structures 106, such as shallow trench isolations (STIs), formed in the substrate 101. In some embodiments of the present invention, the memory cells 105 are a plurality of NVM elements, such as flash memory cells, formed on the substrate 101.

In some embodiments of the present invention, the high-voltage area 103 and the logic area 104 respectively have a doping well formed in the substrate 101. For example, in the present embodiment, the high-voltage area 103 at least has a p-type high voltage doping well with a high doping concentration (denoted as HPWL) and an n-type high voltage doping well with a high doping concentration (denoted as HNWL). The logic area 104 at least has a p-type doping well (denoted as PWL) and an n-type doping well (denoted as NWL). The doping wells, such as the HPWL and the HNWL, formed on the high-voltage area 103 may respectively have a concentration substantially greater than that of the doping wells, such as the PWL and the NWL, formed on the logic area 104.

In addition, a gate dielectric layer 107 can be formed after the high-voltage area 103 and the logic area 104 are defined to cover the HPWL, the HNWL, the PWL and the NWL. In some embodiment of the present invention, the gate dielectric layer 107 preferably may be made of silicon oxide, silicon nitride, silicon carbide or other suitable dielectric material, even or the arbitrary combinations thereof.

Figure 1B:
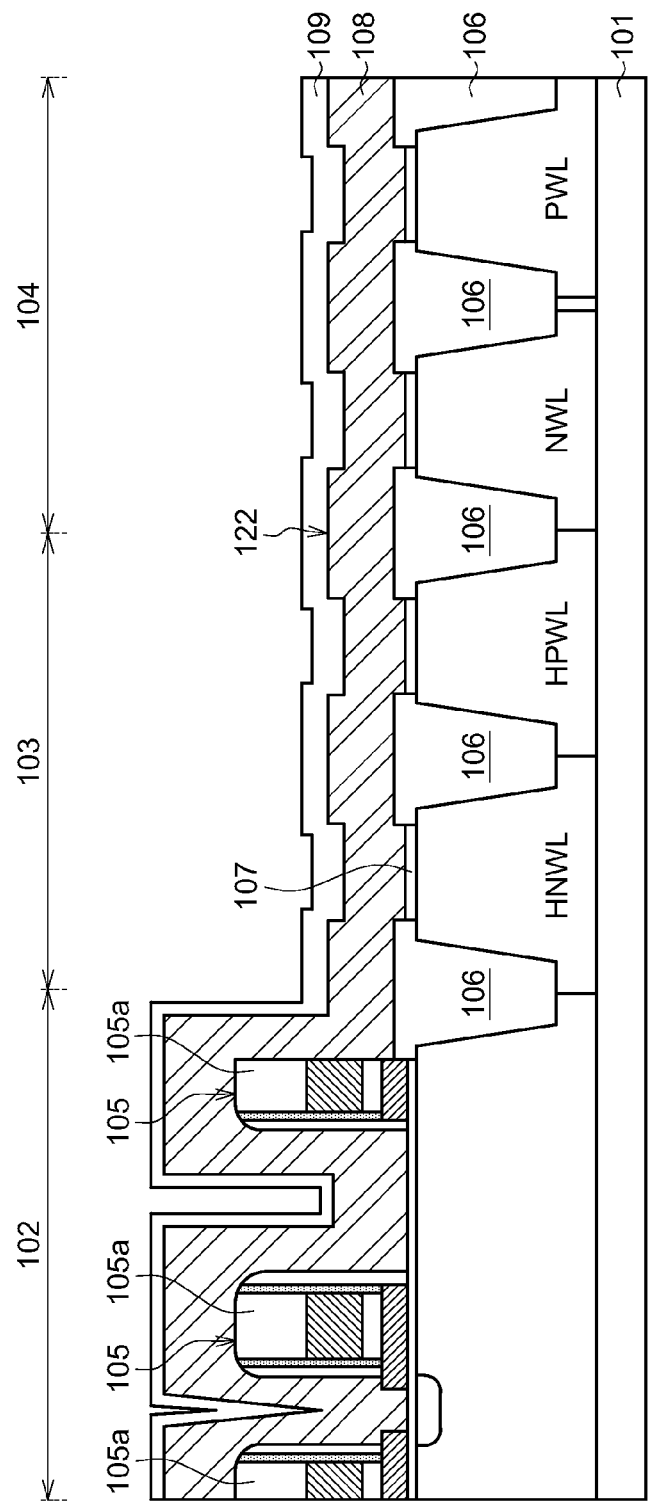

Next, a first conductive layer 108 is formed on the memory area 102, the high-voltage area 103 and the logic area 104 by a deposition process, such as a chemical vapor deposition (CVD) or a physical vapor deposition (PVD), and then a capping layer 109 is formed on the first conductive layer 108 (see FIG. 1B).

In some embodiments of the present invention, the first conductive layer 108 may be a silicon-containing conductive layer, such as a poly-silicon layer. In some other embodiments, the first conductive layer 108 alternatively can be a metal layer. The first conductive layer 108 has a thickness substantially ranging from 600 angstrom (Å) to 1000 Å. The capping layer 109 has a thickness substantially ranging from 600 Å to 1300 Å. The capping layer 109 preferably is made of silicon oxide, silicon nitride, silicon carbonitride, silicon oxynitride, silicon oxycarbide or the arbitrary combinations thereof.

Figure 1C:
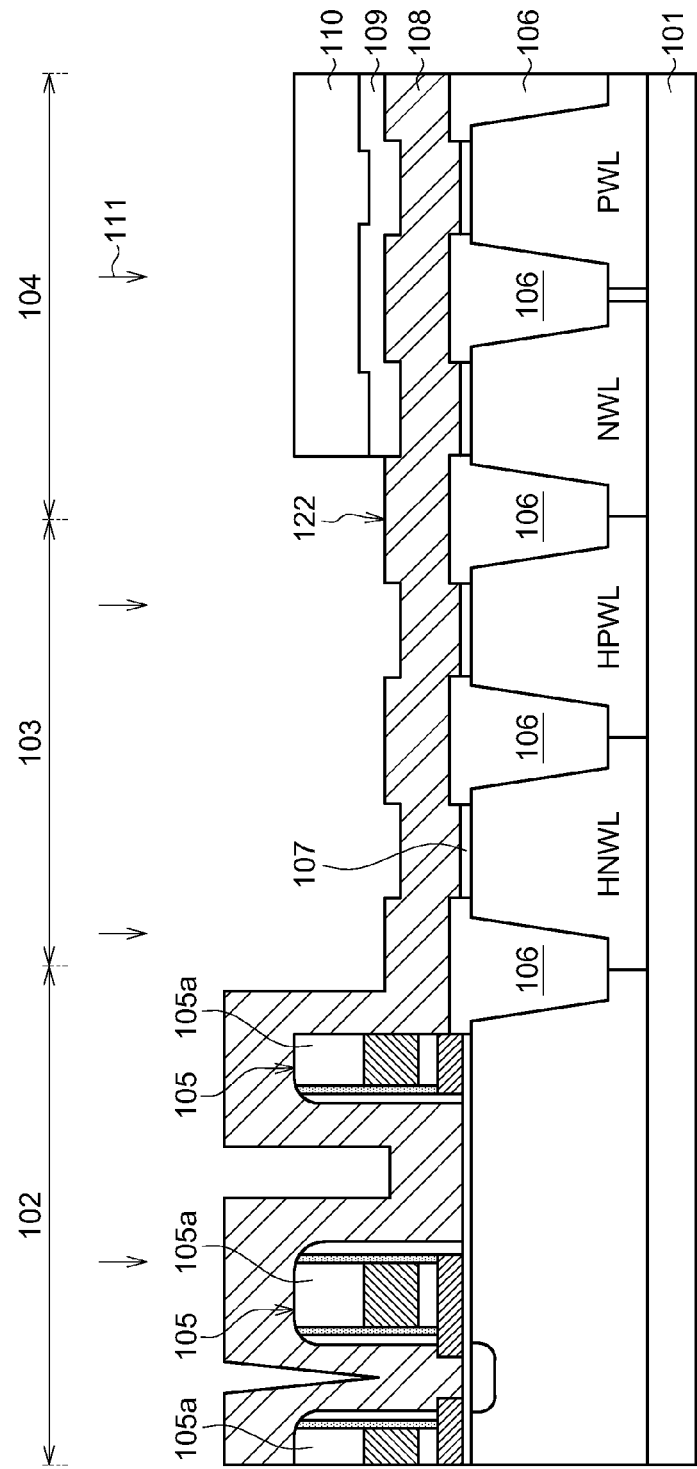

An etching process 111, such as a reactive ion etch (RIE), is performed using a photo-resist layer 110 covering on the logic area 104 as a mask to remove a portion of the capping layer 109, so as to expose a portion of the first conductive layer 108 disposed on the memory area 102 and the high-voltage area 103 (see FIG. 1C).

Figure 1D:
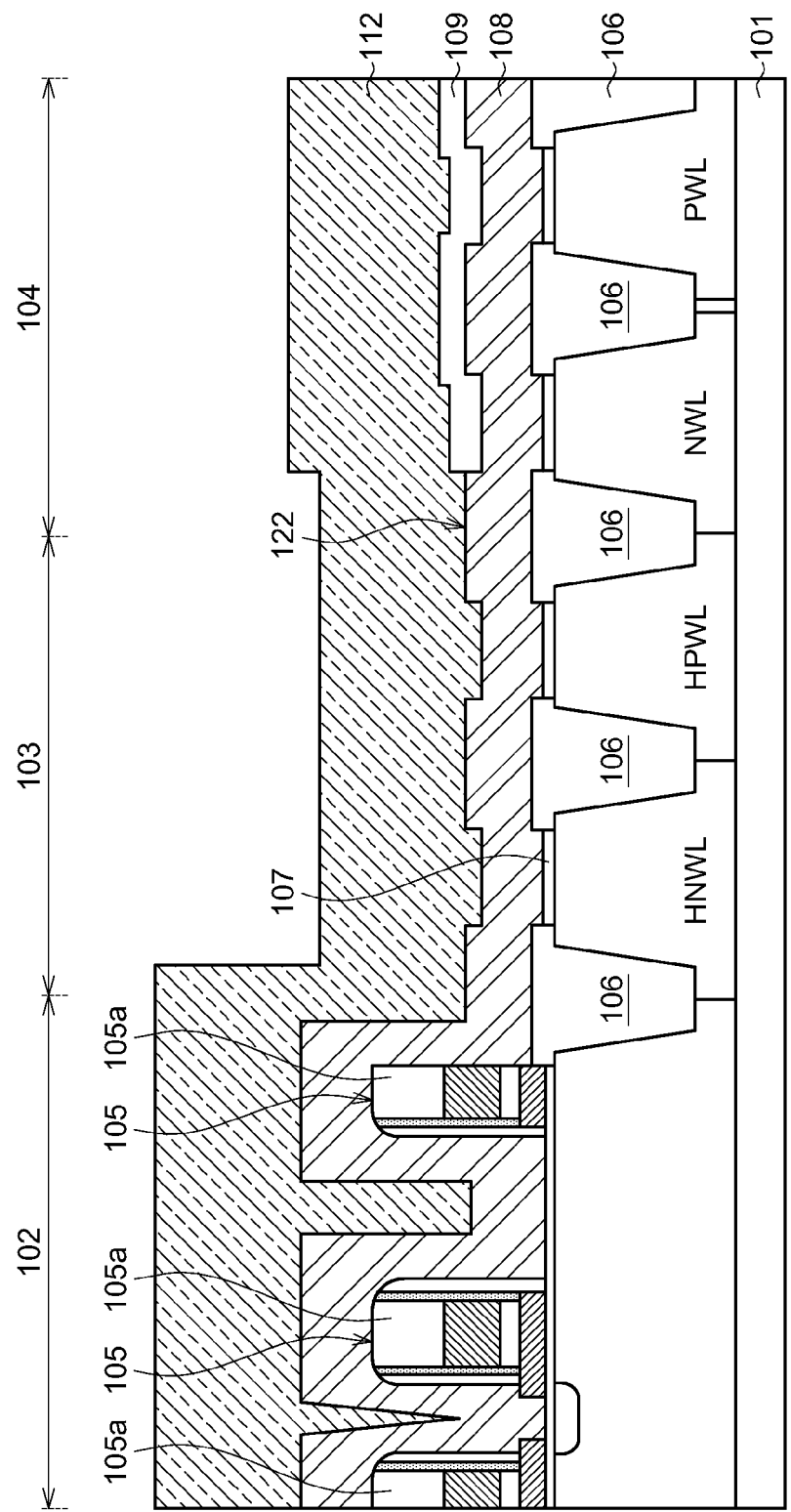

Another deposition process, such as CVD or PVD, are performed to form a second conductive layer 112 on the memory area 102, the high-voltage area 103 and the logic area 104 to cover the portions of the first conductive layer 108 disposed on the memory area 102 and the high-voltage area 103 and to cover the remaining portion of the capping layer 109 disposed on the logic area 104 (see FIG. 1D). The materials used to constitute the second conductive layer 112 may be identical to or different from that used to constitute the first conductive layer 108. For example, the second conductive layer 112 can be either a silicon-containing layer (such as a poly-silicon layer) or a metal layer. The second conductive layer 112 has a thickness substantially ranging from 2000 Å to 5000 Å.

In some embodiments of the present invention, the portions of the first conductive layer 108 and the second conductive layer 112 both disposed on the memory area 102 and the high-voltage area 103 are directly in contact with each other and form a grain boundary 122 at the contact interface of the first conductive layer 108 and the second conductive layer 112.

Figure 1E:
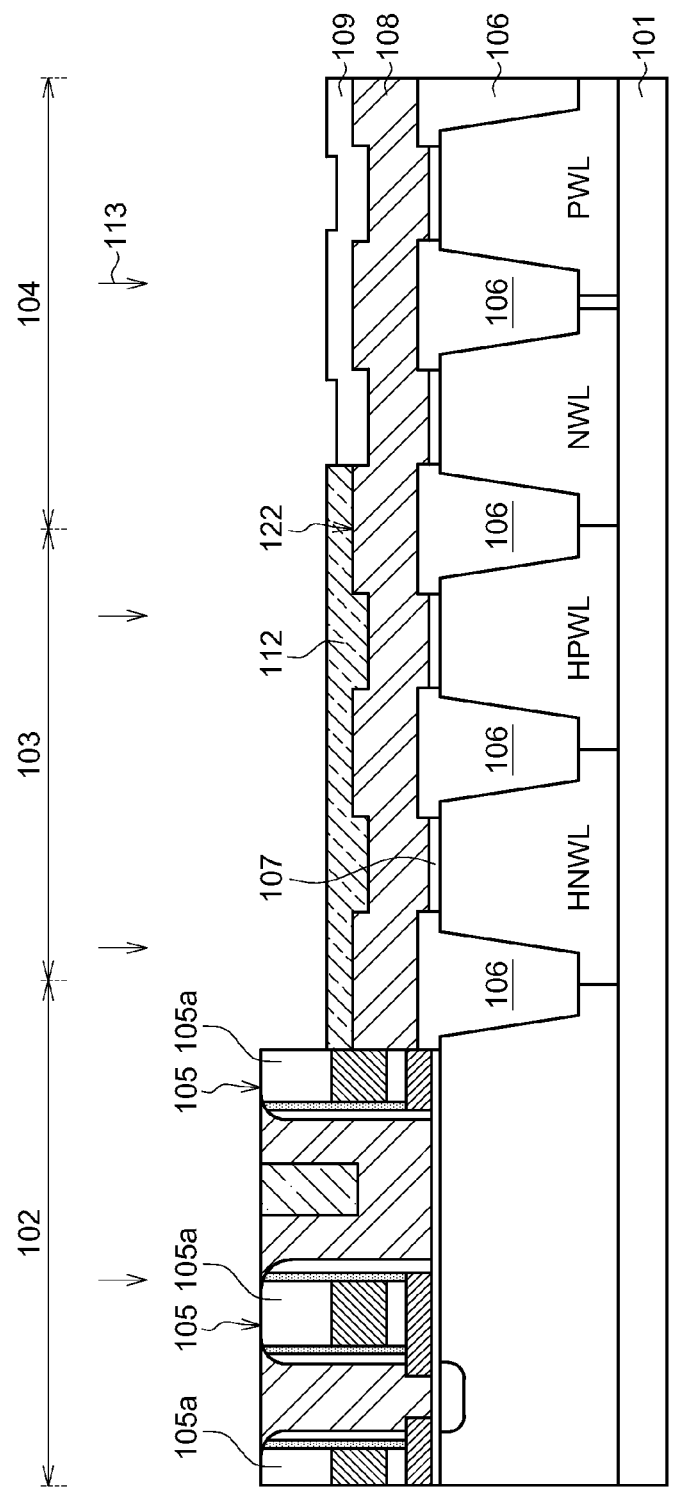

Thereafter, a planarization process 113, such as a chemical-mechanical polishing (CMP), is performed using the remaining portion of the capping layer 109 as a stop layer to remove the portion of the second conductive layer 112 disposed on the memory area 102 and the high-voltage area 103, so as to expose a hard mask layer 105a of the memory cells 105 (see FIG. 1E).

Figure 1F:
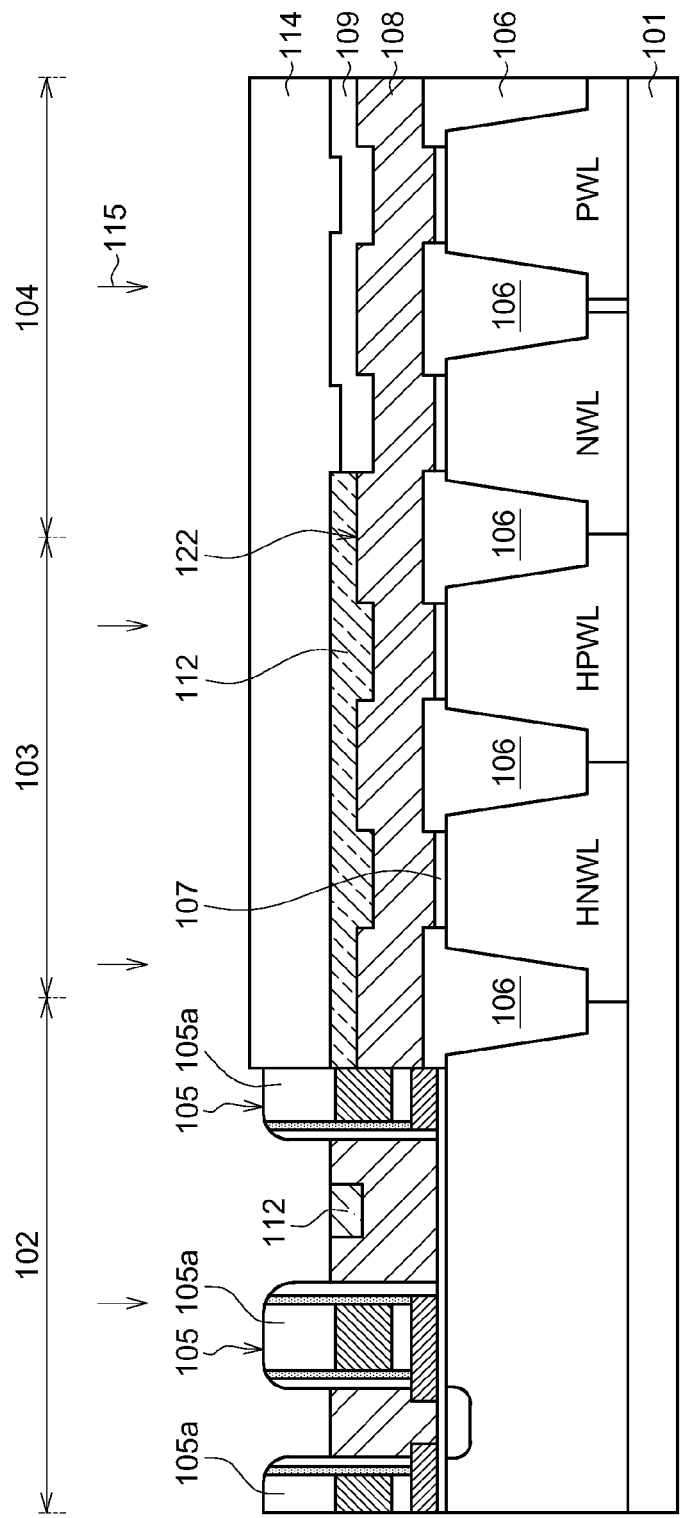
Figure 1G:
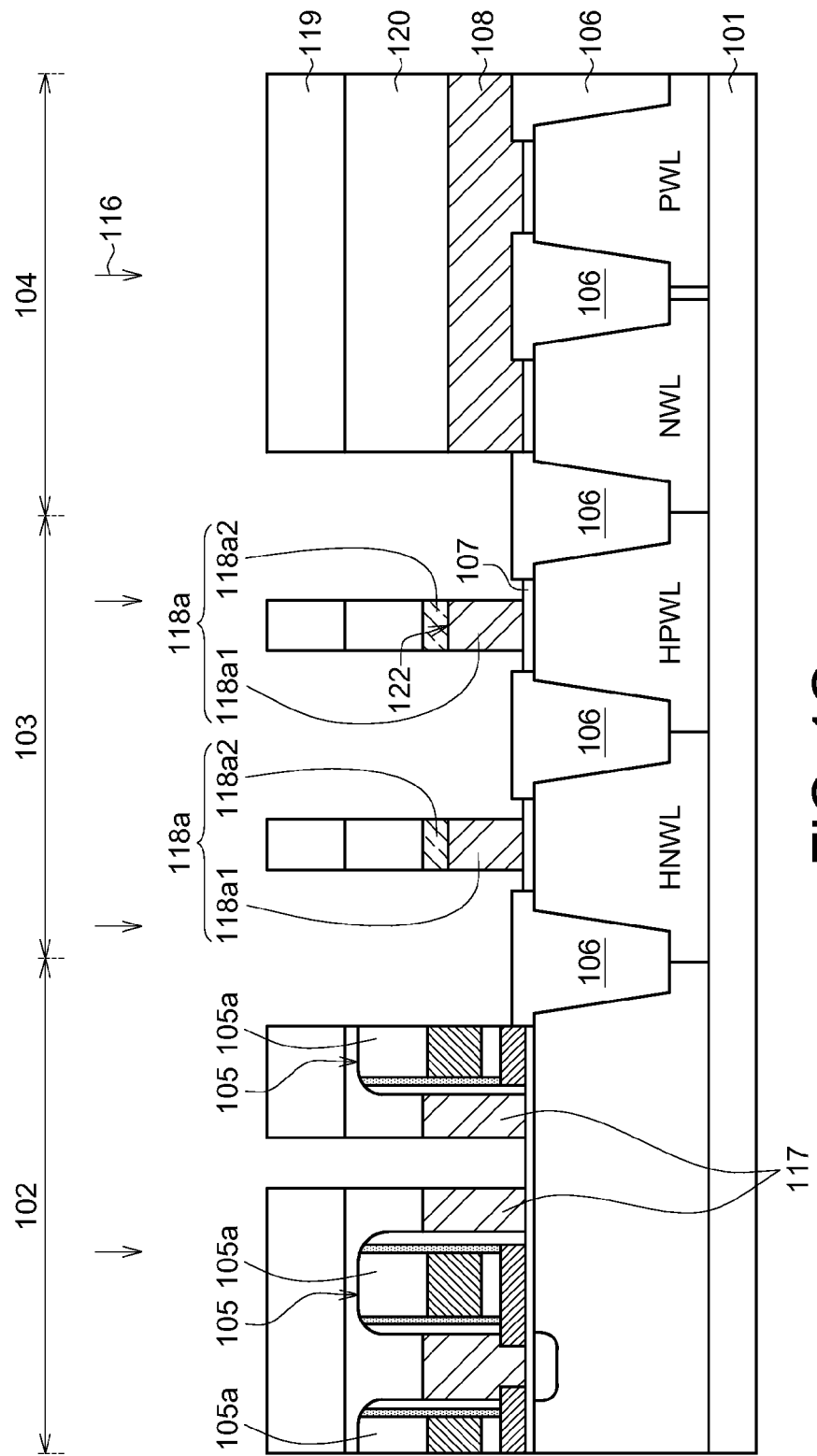

An optional photo-resist covering on the high-voltage area 103 and the logic area 104 may be utilized to perform an etch-back process 115, whereby portions of the first conductive layer 108 and the second conductive layer 112 disposed on the memory area 102 are removed (see FIG. 1F).

After the remaining portion of the capping layer 109 is removed, at least one etching process is performed to pattern the portions of the first conductive layer 108 disposed on the memory area 102 and the high-voltage area 103, so as to define at least one word line 117 on the memory area 102 and to define at least one high-voltage gate electrode 118a on the high-voltage area 103.

In some embodiments of the present invention, the etching processes used for forming the word line 117 and the high-voltage gate electrode 118a are implemented by the same reticle 119 used to patterning a photo-resist 120 serving as the etching mask and covering on the memory area 102, the high-voltage area 103 and the logic area 104. After the portions of the first conductive layer 108 disposed on the memory area 102 and the high-voltage area 103 are removed, at least one word line 117 is defined on the memory area 102, and two high-voltage gate electrodes 118a are respectively defined on the HPWL and the HNWL of the high-voltage area 103 (see FIG. 1G).

Since the word line 117 and the high-voltage gate electrodes 118a are defined by the same etching process 116, namely, the word line 117 and the high-voltage gate electrode 118a are formed by the same etching step utilizing identical reticle 119 that has a RT substantially greater than the conventional reticle merely prepared to form the word lines, thus the endpoint of the etching process 116 for removing the portions of the first conductive layer 108 and the second conductive layer 112 can be determined by an endpoint detection rather than the traditional approach of which determining the end point by counting the etching time. Such that the etching process 116 can be controlled more precisely.

Figure 1H:
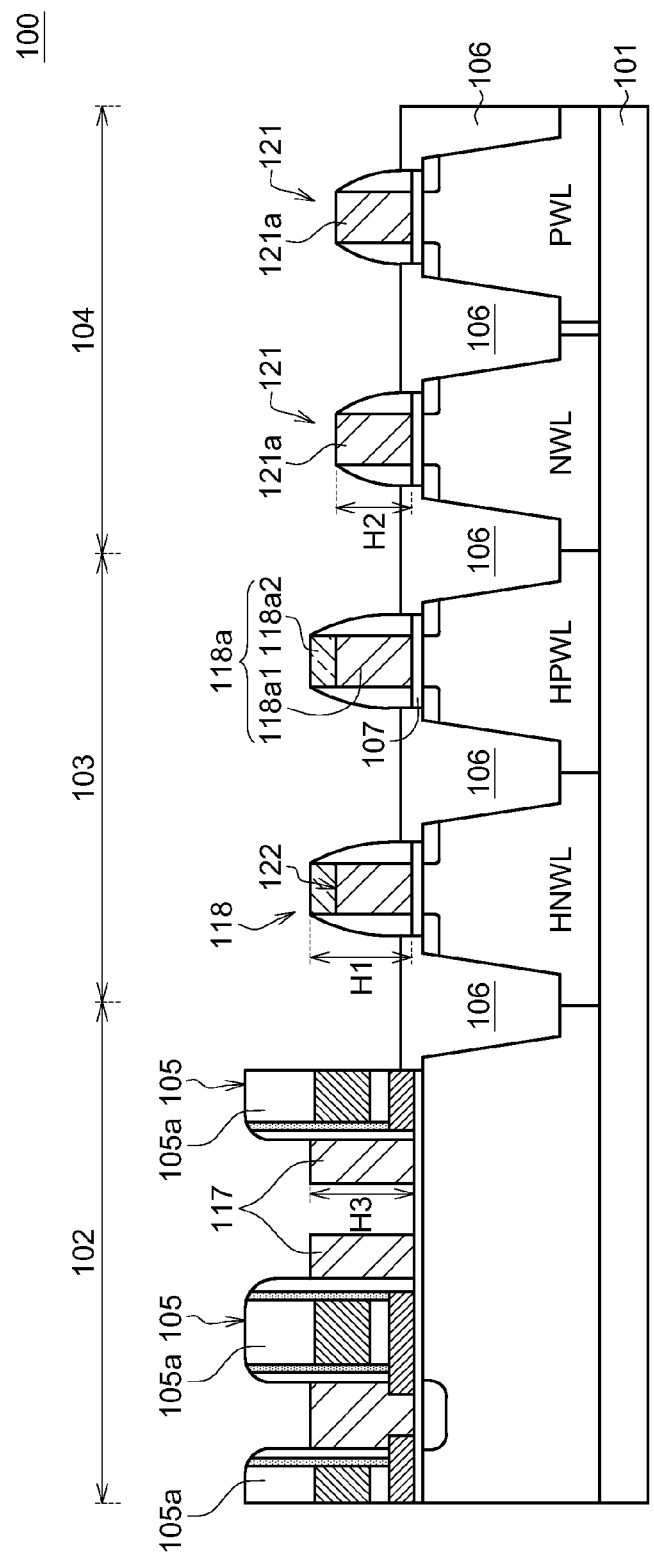

Subsequently, another etching step utilizing another reticle (not shown) is then performed to patterning the first conductive layer 108, so as to define at least one logic gate electrode 121a on the logic area 104. After a series of front-end-of-line (FEOL) processes are performed, the semiconductor device 100 as shown in FIG. 1H can be accomplished. In the present embodiment, the resulted semiconductor device 100 includes a substrate 101, a plurality of memory cells 105, a logic transistor 121 having the logic gate electrode 121a and a high-voltage transistor 118 having the high-voltage gate electrode 118a. The substrate 101 includes at least one memory area 102, a high-voltage area 103 and a logic area 104. The memory cells 105 are disposed on the memory area 102. The logic transistor 121 is disposed on the logic area 104. The high-voltage transistor 118 is disposed on the high-voltage area 103.

The high-voltage gate electrode 118a of the high-voltage transistor 118 is constituted by a portion of the first conductive layer 108 and a portion of the second conductive layer 112 in contact with each other and respectively stacked on the high-voltage area 103. In the present embodiment, the high-voltage gate electrodes 118a can be divided into a first portion 118a1 and a second portion 118a2 by the grain boundary 122 formed at the contact interface of the first conductive layer 108 and the second conductive layer 112, nevertheless the first conductive layer 108 and the second conductive layer 112 are both made of poly-silicon. The logic gate electrode 121a of the logic transistor 121 is merely formed by a portion of the first conductive layer 108. It can be seen that the thickness H1 of the high-voltage gate electrode 118a is substantially greater than the thickness H2 of the logic gate electrode 121a. In some preferred embodiments, the thickness H1 of the high-voltage gate electrode 118a may range from 1200 Å to 1600 Å; the thickness H2 of the logic gate electrode 121a may range from 600 Å to 1000 Å; and the thickness H3 of the word line 117 may range from 1200 Å to 1500 Å. In the present embodiment, the thickness H3 of the word line 117 is greater than the thickness H2 of the logic gate electrode 121a.

Because the logic gate electrode 121a and the high-voltage gate electrode 118a are not defined by the same etching step using identical reticle and the high-voltage gate electrode 118a has a thickness substantially greater than that of the logic gate electrode 121a. The high-voltage transistor 118 with the high-voltage gate electrode 118a has a breakdown voltage substantially greater than that of a traditional high-voltage transistor having a unit gate electrode thickness. Such that, the subsequent ion implantations used to enhance the breakdown voltage of the high-voltage transistor 118 may not be necessary or partially required to make the high-voltage transistor 118 reaching the predetermined voltage standard.

In accordance with the aforementioned embodiments of the present invention, a semiconductor device and method for fabricating the same are provided, wherein a substrate including at least one memory area, a high-voltage area, a logic area and a plurality of memory cells formed in the memory area is firstly provided. Next, a first conductive layer and a capping layer are formed in sequence to cover the memory area, the high-voltage area and the logic area. A portion of the capping layer covering on the memory area and the high-voltage area is then removed, and a second conductive layer directly in contact with the first conductive layer is formed on the memory area and the high-voltage area. Subsequently, portions of the first conductive layer and the second conductive layer disposed on the memory area and the logic area are removed by etch steps using the same reticle, so as to define at least one word line electrically connected to one of the memory cells on the memory area and simultaneously to define at least one high-voltage gate electrode on the high-voltage area. Thereinafter, another reticle is utilized to perform another etching process to remove the portion of the first conductive layer disposed on the logic area, whereby at least one logic gate electrode is defined on the logic area and the high-voltage gate has a thickness substantially greater than that of the logic gate electrode.

Since the reticle provided by the present invention that is prepared both to define the word line and to define the high-voltage gate electrode can have a RT substantially greater than the conventional reticle that is merely prepared for forming the word lines, thus the endpoint of the etching step that utilize the present reticle for removing the portions of the first conductive layer and the second conductive layer can be determined by an endpoint detection rather than the traditional approach of which determining the end point by counting the etching time. Such that the etching process of the present method can be controlled more precisely. In addition, because the high-voltage gate electrode formed by the present method having a thickness substantially greater than that of the logic gate electrode, thus the resulted high-voltage transistor can have a breakdown voltage higher than that of the logic transistor formed on the logic area, the predetermined voltage standard can be reached easier and additional ion implantations may be unnecessary. As a result the process window of the semiconductor device can be greatly enlarged.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a substrate, at least comprising a memory area, a high-voltage area and a logic area;
   a plurality of memory cells, disposed on the memory area;
   a logic gate electrode, disposed on the logic area; and
   a high-voltage gate electrode, having a first portion and a second portion in contact with each other and stacked on the high-voltage area, wherein the high-voltage gate electrode has a thickness substantially greater than that of the logic gate electrode.

2. The semiconductor device according to claim 1, further comprising a word line disposed on the memory area and electrically connected to one of the memory cells, wherein the word line has a thickness substantially greater than that of the logic gate electrode.

3. The semiconductor device according to claim 2, wherein the thickness of the word line substantially ranges from 1200 Å to 1500 Å; the logic gate electrode has a thickness substantially ranging from 600 Å to 1000 Å.

4. The semiconductor device according to claim 1, wherein the first portion and the second portion comprise poly-silicon, and there is a grain boundary formed between the first portion and the second portion.

5. The semiconductor device according to claim 1, wherein the high-voltage gate electrode has a thickness ranging from 1200 Å to 1600 Å.

6. The semiconductor device according to claim 1, further comprising a gate dielectric layer formed between the logic gate electrode and the substrate as well as between the high-voltage gate electrode and the substrate.

7. A method for fabricating a semiconductor device, comprising:
   providing a substrate comprising a memory area, a high-voltage area, a logic area and a plurality of memory cells formed on the memory area;
   forming a first conductive layer and a capping layer in sequence to cover the memory area, the high-voltage area and the logic area;
   removing a portion of the capping layer covering on the memory area and the high-voltage area;
   forming a second conductive layer to cover the remaining portion of the capping layer and a portion of the first conductive layer disposed on the memory area and the high-voltage area;
   performing a planarization process using the remaining portion of the capping layer as a stop layer;
   removing the remaining portion of the capping layer;
   removing portions of the first conductive layer and the second conductive layer to define at least one word line electrically connected to one of the memory cells on the memory area and to define at least one high-voltage gate electrode on the high-voltage area; and
   defining at least one logic gate electrode on the logic area, wherein the high-voltage gate electrode has a thickness substantially greater than that of the logic gate electrode.

8. The method according to claim 7, further comprising an etch-back process for removing portions of the first conductive layer and the second conductive layer disposed on the memory area.

9. The method according to claim 7, wherein the first conductive layer has a thickness ranging from 600 Å to 1000 Å; the capping layer has a thickness substantially ranging from 600 Å to 1300 Å; and the second conductive layer has a thickness substantially ranging from 2000 Å to 5000 Å.

10. The method according to claim 7, wherein the word line and the high-voltage gate electrode are formed by an identical etching process.

11. The method according to claim 7, wherein the process of removing portions of the first conductive layer and the second conductive layer to define the word line and the high-voltage gate electrode utilizes an identical reticle.

12. The method according to claim 11, wherein the process of removing portions of the first conductive layer and the second conductive layer to define the word line and the high-voltage gate electrode comprises an etching step using an endpoint detection to control an etching step of the etching step.

13. The method according to claim 7, further comprising steps of forming a gate dielectric layer to cover the high-voltage area and the logic area of the substrate, prior to the forming of the first conductive layer and the capping layer.

14. The method according to claim 7, wherein the word line has a thickness substantially greater than that of the logic gate electrode.

15. The method according to claim 7, wherein the word line has a thickness substantially ranging from 1200 Å to 1500 Å; and the logic gate electrode has a thickness substantially ranging from 600 Å to 1000 Å.

16. The method according to claim 7, wherein the high-voltage gate electrode has a first portion and a second portion comprising poly-silicon, and there is a grain boundary formed between the first portion and the second portion.

17. The method according to claim 7, wherein the high-voltage gate electrode has a thickness substantially ranging from 1200 Å to 1600 Å.

* * * * *